(12) United States Patent
Fricke et al.

(10) Patent No.: US 6,839,263 B2
(45) Date of Patent: Jan. 4, 2005

(54) MEMORY ARRAY WITH CONTINUOUS CURRENT PATH THROUGH MULTIPLE LINES

(75) Inventors: Peter Fricke, Corvallis, OR (US); Andrew VanBrocklin, Corvallis, OR (US); Warren Jackson, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 24 days.

(21) Appl. No.: 10/358,706

(22) Filed: Feb. 5, 2003

(65) Prior Publication Data

US 2004/0151024 A1 Aug. 5, 2004

(51) Int. Cl.[7] ................................................ G11C 5/06
(52) U.S. Cl. .......................... 365/63; 365/51; 365/174
(58) Field of Search ........................... 365/51, 63, 105, 365/174, 177, 171, 47, 55, 74

(56) References Cited

U.S. PATENT DOCUMENTS

| | | | |
|---|---|---|---|
| 5,267,210 A | | 11/1993 | McClure et al. |
| 5,745,407 A | * | 4/1998 | Levy et al. .................. 365/159 |
| 6,111,783 A | | 8/2000 | Tran et al. |
| 6,178,131 B1 | | 1/2001 | Ishikawa et al. |
| 6,215,694 B1 | | 4/2001 | Li et al. |
| 6,301,186 B1 | | 10/2001 | Naffziger |
| 6,643,159 B2 | | 11/2003 | Fricke et al. |
| 6,687,147 B2 | | 2/2004 | Fricke et al. |
| 6,737,675 B2 | * | 5/2004 | Patel et al. .................. 257/67 |
| 6,781,858 B2 | * | 8/2004 | Fricke et al. .................. 365/51 |

* cited by examiner

*Primary Examiner*—Gene N. Auduong

(57) ABSTRACT

A memory array according to a particular embodiment of the invention includes a substrate, a plurality of first select-lines disposed in a plurality of planes generally parallel to the substrate, a plurality of second select-lines formed in pillars disposed generally orthogonal to the substrate, a plurality of memory cells coupled to the first select-lines and the second select-lines, and a current path connection providing a continuous current path through a selected plurality of the pillars to heat the selected pillars and cause at least one memory cell associated with the selected pillars to be reset.

26 Claims, 17 Drawing Sheets

US 6,839,263 B2

MEMORY ARRAY WITH CONTINUOUS CURRENT PATH THROUGH MULTIPLE LINES

BACKGROUND OF THE INVENTION

Personal computers, workstations, graphic subsystems of displays, electronic games, and other electrical devices all include memory systems for storing data. An ever-increasing demand exists for larger and faster memory systems. Attributes of memory technologies include data access time (i.e. speed), cost, reliability, size (i.e. density), and electrical power dissipation. Memory technologies include, for example, floppy drives, hard drives, compact disc/digital-video disc (CD/DVD) drives and semiconductor memories. Semiconductor memories include dynamic random access memories (DRAMs), static random access memories (SRAMs), read-only memories (ROMs), programmable read-only memories (PROMs), one-time programmable (OTP) memories, electronically erasable read-only memories (EEPROMs), FLASH memory, and video random access memories (VRAM), for example. While microprocessor-processing power has increased significantly in keeping with Moore's Law, memory devices that communicate with microprocessors have been able to keep up only with increasing memory density, and not speed. One issue associated with increasing the speed of memory devices is that as the density of memory cells increases within a given memory technology, capacitive delays, sense circuits and conventional memory layout organizations keep access time improvements minimal.

SUMMARY OF THE INVENTION

A memory array according to a particular embodiment of the invention includes a substrate, a plurality of first select-lines disposed in a plurality of planes generally parallel to the substrate, a plurality of second select-lines formed in pillars disposed generally orthogonal to the substrate, a plurality of memory cells coupled to the first select-lines and the second select-lines, and a current path connection providing a continuous current path through a selected plurality of the pillars to heat the selected pillars and cause at least one memory cell associated with the selected pillars to be reset. It is desirable to develop new memory architectures that not only increase density, but the speed of data access as well.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
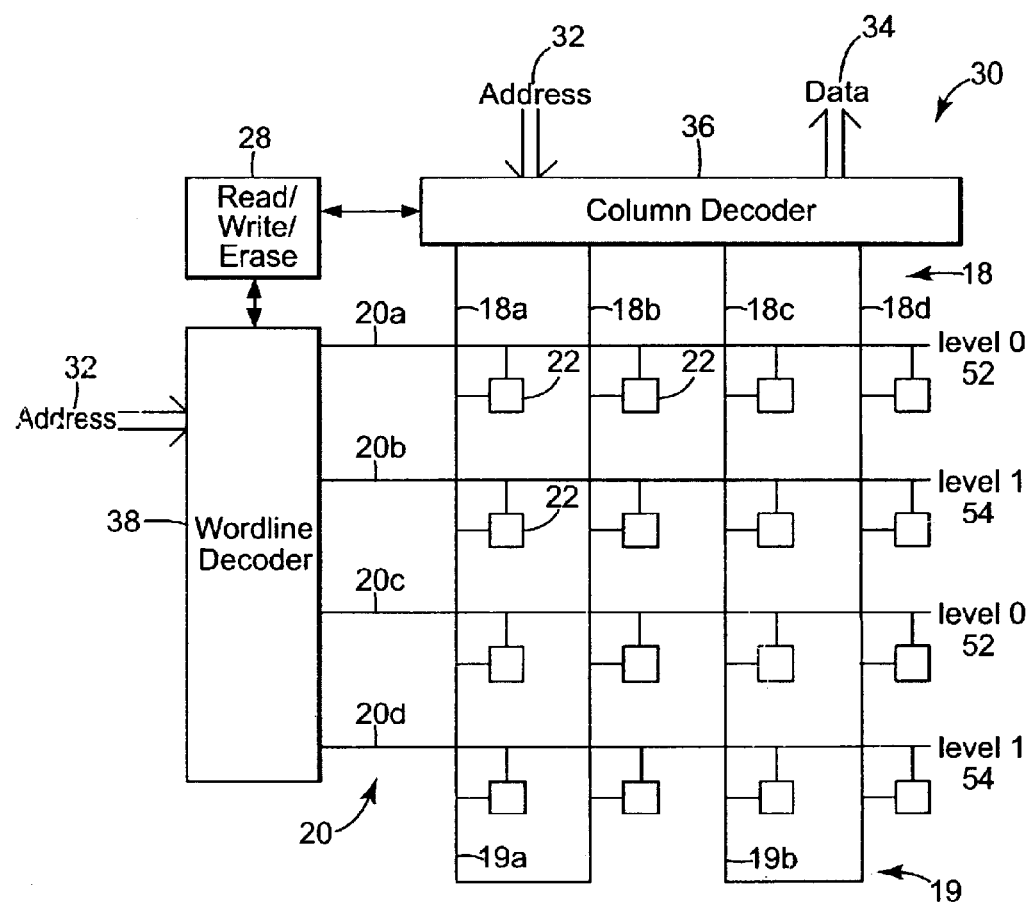
FIG. 1 is a schematic of a memory array according to an embodiment of the invention.

Certain memory architecture embodiments described herein use a vertical pillar to form either the row or column lines used to select a particular memory cell within an array of memory cells. This architecture creates a 'cubed' array structure out of a plurality of memory cells that optionally is volumetrically more space-efficient, faster, and easier to manufacture than previous three-dimensional-architectures that simply expand cross-point memory arrays by stacking them. Certain embodiments described herein involve rewritable storage elements, for example phase-change storage elements. Other embodiments involve write-once arrays, also known as one-time programmable (OTP) memory or write-once read-many (WORM) memory. When implementing write-once arrays using vertical pillars as bit-lines (or alternatively word-lines) in a 'cubic' (i.e. having three dimensions, although not each necessarily the same length) memory array, a tunnel junction may be formed on the vertical pillar at the intersection of the horizontal word-lines and the vertical bit-lines.

For each storage element, the cubic memory array includes a control element that is physically adjacent to the storage element and in series with it between the horizontal word-lines and the vertical bit-lines. Those of ordinary skill in the art should understand that the word-lines may instead be made vertical and the column lines horizontal without departing from the scope and spirit of the invention. For clarity, the vertical select-lines are referred to herein as columns or bit lines, and the horizontal select-lines are referred to as word-lines or row-lines. Alternatively, the horizontal select-lines optionally are referred to as drive lines and the vertical select-lines as sense lines. Because the orientation of the drive and sense lines is interchangeable, there is in actuality a set of first select-lines and a set of second select-lines that are disposed in separate planes that are orthogonal to each other to form the cubic memory array. One of the first or second select-lines forms a vertical pillar with respect to the plane of the substrate on which the memory array is formed.

A memory array is fabricated on a substrate that defines a plane. The memory array includes a plurality of memory cells vertically stacked. The memory cells include a dielectric layer forming an insulating surface and a word-line disposed parallel to the plane of the substrate on the dielectric layer. The memory cell has a control element surrounding the word-line and a memory storage element surrounding at least a portion of the control element, according to one example. The control element has a first cross-sectional area. The storage element has a second cross-sectional area. The cross-sectional area of the storage element optionally is substantially smaller than the cross-sectional area of the control element so that the storage element changes its state while the control element remains unaffected. The control element and the storage element may be fabricated as similar types of devices, for example tunnel junction devices. Alternatively, when a phase-change material is used for the storage element, the cross-sectional area of the storage element may be less, the same, or larger than the cross-sectional area of the control element. The storage element cross-sectional area is less than the control element cross-sectional area, to minimize power and increase the speed of changing the memory state. The memory cell includes a vertical pillar, substantially orthogonal to the plane of the substrate and contacting the memory storage element.

With this vertical pillar structured cubic memory array, the number of memory storage elements optionally is limited only by the aspect ratio of semiconductor processes to vertically stack columns, control elements and state change memory elements for each pillar. One feature of this three-dimensional architecture with vertical pillars is that stacking of multiple cubic arrays enables larger arrays than is possible with conventional semiconductor processes. With three-dimensional architecture of vertical pillars, up to 20 or more horizontal word-lines can be accessed per each vertical bit-line.

Further, the cubic memory array optionally is embedded with integrated circuits such as microprocessors, graphic processors, and storage processors, to name a few. For instance, a traditional central processing unit (CPU) uses large arrays of memory for internal level 1 and level 2 cache memory. These cache memories typically consume a large area within a traditional processor layout. By using a cubic memory array that is disposed on top of the processor core computer circuits, a smaller die size in terms of area is achieved.

Conventional memory storage elements are typically implemented as parallel plate structures (or vertical capacitive wells) whose minimum area is traditionally limited by the minimum semiconductor photolithography process geometries and the need for a transistor-based control field-effect transistor (FET). The embodiments of three-dimensional architecture disclosed herein enable the forming of memory storage elements in contact with the vertical pillars at the intersection of the horizontal and vertical select-lines. This formation enables a memory storage element that has an area determined by the height of the edge of the horizontal select-lines and the width of the vertical select pillar, for example. Therefore, the area of the memory storage element optionally is greatly reduced in this architecture, thus enabling faster access speeds and requiring less energy when performing a fusing operation for tunnel junction or dielectric rupture devices. Further, when the memory storage element is formed using a tunnel junction on the vertical edges of the horizontal and vertical select-lines, the effects of defects found in conventional planar tunnel junctions is greatly reduced. By having the memory drive and sense select-lines arranged in horizontal and vertical planes, respectively, the capacitance between the drive and sense select-lines is reduced. This reduced capacitance enables faster access speeds for the memory array.

A cubic memory array of memory cells is created using one of any various semiconductor devices for the storage and control elements that interface to the vertical pillars, which are used as part of the memory selection circuitry. Many implementations of the three-dimensional-architecture are performed using semiconductor equipment and silicon substrates as starting materials. Semiconductor devices according to embodiments of the invention are applicable to a broad range of semiconductor device technologies and may be fabricated from a variety of semiconductor materials. The following description discusses several semiconductor devices according to embodiments of the invention as implemented in silicon substrates, because currently available semiconductor devices generally are fabricated in silicon substrates and the number of applications according to embodiments of the invention will involve silicon substrates. Nevertheless, embodiments of the present invention also may be employed with gallium arsenide, germanium, and other semiconductor materials, as well as thin-film-transistor (TFT) technology using polysilicon on glass substrates. Accordingly, the present invention is not necessarily intended to be limited to those devices fabricated in silicon semiconductor materials, but includes those devices fabricated in one or more current or future substrate or semiconductor materials and technologies. Other substrates that are useful in producing memory arrays according to embodiments of the invention include plastic and cellulose materials.

It should be noted that the drawings are not necessarily true to scale. Further, various parts of the active elements have not been drawn to scale. Certain dimensions have been exaggerated in relation to other dimensions in order to provide a clearer illustration and understanding of the various embodiments.

In addition, although embodiments illustrated herein are sometimes shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device.

FIG. 1 is a schematic diagram of a memory circuit 30 in which a plurality of memory cells 22 are formed in an array, shown here as a two-dimensional 4×4 layout. Each memory cell 22 is connected to one of a set of word-lines 20 (20a–20d) shown as rows and one of a set of bit-lines 18 (18a–18d) shown as columns. As will be described, current loop path connections 19 are formed between specific bit-lines 18, and each memory cell 22 includes a phase-change element 24, according to embodiments of the invention. Connections 19 create current loops, or paths, for current to flow in a continuous path through one or more columns 18. In FIG. 1, connection 19a creates a continuous path between and through columns 18a and 18b, and connection 19b creates a continuous path between and through columns 18c and 18d. According to embodiments of the invention, current flows vertically within one column, horizontally to another column, and then vertically within that column, with logic in the base silicon providing the control. The continuous current paths are designed to heat particular columns 18 and erase phase-change storage elements 24 adjacent the particular heated columns 18.

The memory circuit 30 is connected to a set of external address lines 32 and data lines 34. The address lines 32 contain a location in an encoded form (e.g. binary) for selecting a particular memory cell 22 in the array of memory cells to address. The word-line decoder 38 interprets some of the address lines to decide at which row or word-line the particularly selected memory cell 22 is located. Optionally, only one word-line is selected and driven to a predetermined voltage level, and the other word-lines are driven to a second predetermined voltage level. The address lines 32 are also used by column decoder 36 to select a particular bit-line from bit-lines 18 to interface and decode the selected particular memory cell to at least one of data lines 34 by sensing the state of the selected memory cell. The memory circuit 30 also includes read/write/erase circuitry 28 that is connected to the word-line decoder 38 and the column decoder 36 to provide the appropriate voltages and timing to the selected and deselected memory cells 22 during each operation. It should be noted that the erase operation optionally is not present on all types of memory circuits 30.

FIG. 1 also illustrates one type of organization of the array of memory cells 22 forming an embodiment of a cubic memory array. In this example, two levels (or alternatively two planes) of memory cells 22 are formed, one upon the other. The memory cells of each level are substantially aligned with memory cells in the adjacent level. Level 0 (52) includes word-lines 20a and 20c. Level 1 (54) includes word-lines 20b and 20d. Level 0 (52) and level 1 (54) are formed into respective planes that are substantially parallel to a substrate surface. Columns or bit-lines 18 (18a–18d) are formed in another plane that is orthogonal to the planes of the word-lines and the substrate. Thus each of the bit-lines 18 forms a 'vertical' pillar with respect to a 'horizontal' substrate. The orientation chosen is for convenience in the description; the actual orientation of an embodiment is arbitrary. Other arrangements for selecting the organization of the word-lines and column bit-lines into a cubic array exist.

Figure 2:
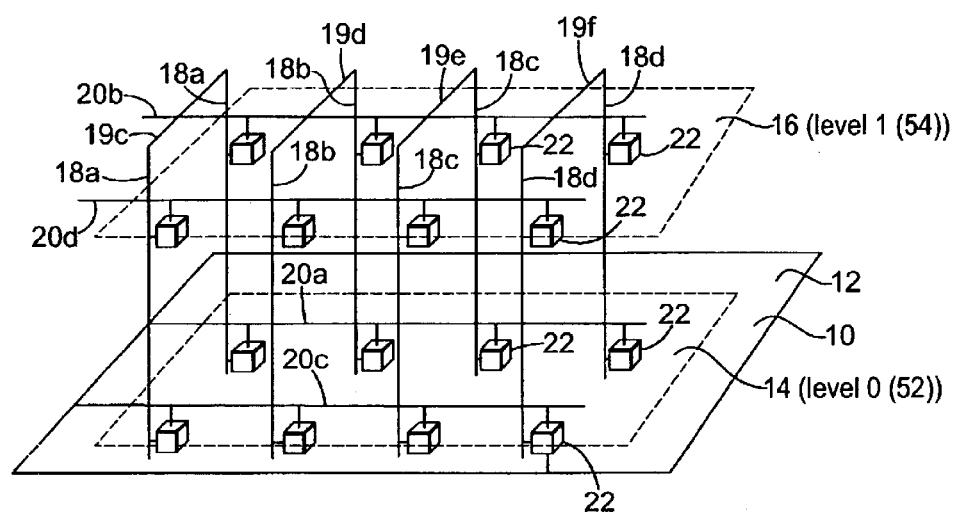
FIG. 2 is a schematic of a physical layout of a memory array according to an embodiment of the invention.

FIG. 2 shows a physical layout of the cubic memory array of FIG. 1, according to one example. Here a substrate 10, such as a silicon substrate, forms a generally planar surface 12 in which there is incorporated control circuitry such as column decoder 36, word-line decoder 38, and read/write/erase circuitry 28. Substrate 10 also includes circuitry for controlling current to and through connections 19. Associated complementary metal oxide semiconductor (CMOS) logic, for example, is provided to select each end of a current path created by one or more pillars 18 and one or more connections 19. At least two pillars 18 are interconnected into a continuous current path loop.

Disposed on the planar surface 12 of substrate 10 is a first memory plane 14 (such as level 0 (52)) formed of an array of memory cells 22. The first memory plane 14 has rows of memory cells 22 that are connected by word-lines 20, as shown. Disposed on the first memory plane 14 is a second memory plane 16 (such as level 1 (54)) of memory cells 22 that are substantially aligned with the memory cells 22 of the first memory plane 14. The two memory planes 14, 16 are interconnected using vertical bit-lines 18, as shown, thereby forming a cubic array of memory. Vertical bit-lines 18 are connected by current loop path connections 19. Specifically, in FIG. 2, connections 19c, 19d, 19e and 19f are selected to connect vertical bit-lines 18a—18a, 18b—18b, 18c—18c and/or 18d—18d, respectively, in a continuous current path.

A cubic array for purposes of this disclosure is defined as one having three dimensions. The length of each actual dimension of the array may be different, i.e., an actual cube of three equal lengths is not necessarily formed. The term cubic refers to the basic three-dimensional structure of the memory array. Actual dimension lengths will vary depending on a designer's choice of the number of memory cells per plane and the number of planes to be stacked.

By using vertical pillars as select-lines to address a memory cell 22, the memory cells 22 are stacked closer together to increase volumetric efficiency. Further, by taking advantage of the process used to create the cubic memory array, simplified memory cells 22 optionally are formed. The memory cells 22 include at least one storage element, e.g. a phase-change storage element usually configurable in an on or off state, or containing charge that represents an on or off state. Alternatively, memory cells 22 optionally also store multiple states, or charges that represent multiple states, so that more than one bit of information is stored per memory cell 22. As referenced previously, embodiments of the invention provide current along a continuous path through multiple pillars 18 to heat the pillars and erase or reset associated or adjacent memory cells 22, specifically the storage elements thereof.

Figure 3:
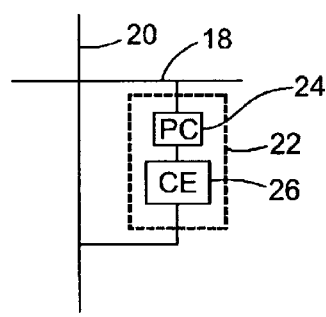
FIG. 3 shows a memory cell used in the memory array of FIG. 2, according to an embodiment of the invention.

FIG. 3 is a block diagram of a representative memory cell 22. The memory cell 22 includes a phase-change storage element 24 and a control element 26 in series between word-line 20 and bit-line 18. The phase-change material is settable to various states with electrical current and temperature. For example, phase-change material according to embodiments of the invention may be in an amorphous (or non-crystalline) state, having high resistance between two electrodes, or in a crystalline state, having low resistance between two electrodes. The state of the storage element thus changes from high to low resistance, or vice versa, and two logical states are programmed and sensed, for reading the memory. The phase-change material also is erasable, by heating to a high enough temperature to change the material back to amorphous and then cooling rapidly enough to freeze in the amorphous state. Applying a write current across the storage element creates a low-resistance path, by locally heating the element to a high enough temperature, but lower than the erase temperature, and then cooling down in the crystalline (low-resistance) state. Examples of phase-change materials for storage element 24 include chalcogenide alloys such as: GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$ and GeSbTe.

Other phase-change materials optionally are used. For example, a read/writeable (or write/erase/write) state-change element such as germanium telluride (GeTe) is contemplated. GeTe optionally is reversibly changed from a semiconducting (amorphous) to a metallic (crystalline) state by heating and cooling it at a proper rate. For example, if the GeTe is doped so that it is p-type when in its semiconducting state and is deposited on top of an n-type semiconductor-layer, then a large contrast will be seen in the number of carriers swept across the junction if the GeTe is changed to its metallic state. By using GeTe or equivalent phase-change material, the memory cell is capable of being read-writeable, e.g. being capable of writing, erasing, and then writing again many times.

Current loop path connections 19, used with phase-change storage elements 24, provide single-erase, multiple-erase, and/or rewrite capabilities. In the case of multiple-erase capability, multiple memory cells optionally are erased generally simultaneously. Current loop paths 19 and associated logical circuitry provide local heating of selected columns 18. Such heating changes the state of the storage element(s) 24 of one or more memory cells 22 that are immediately adjacent, directly in contact with, and/or otherwise associated with the selected columns 18. Embodiments of the invention achieve better control over the thermal characteristics and requirements of phase-change storage elements 24, and provide an additional degree of freedom by injecting thermal energy into the selected memory cell locations. Further, a relatively small amount of power or current is used to change the state of storage elements 24, according to embodiments of the invention, compared to a system using e.g. individual heaters for each memory cell 22.

Control element 26 optionally is a current steering device that exhibits non-linear behavior between voltage applied across it and the current flowing through it. Alternatively, the control element 26 optionally has linear behavior such as when implemented using a resistor. Control element 26 optionally is formed of a tunnel junction device or pn, pin, or Schottky diodes. Other diodes that optionally are used include Zener diodes, avalanche diodes, tunnel diodes, and a four-layer diode such as a silicon-controlled rectifier. Alternatively, the control element 26 optionally comprises one or more junction field effect or bipolar transistors, for example. When the control element 26 is a diode, it optionally is formed using doped polysilicon, amorphous silicon, or microcrystalline silicon. The control element 26 also optionally is selected from a group of options including: a recrystallized semiconductor, an amorphous semiconductor, a polycrystalline semiconductor, a junction field effect transistor, a junction field effect transistor with its gate connected to its source or drain, an insulated gate field effect transistor with its gate connected to its source or drain, a four-layer diode, an NPN transistor, and a PNP transistor. The control element 26 is sized sufficiently to carry an adequate current such that the state of storage element 24 is changed when desired. This sizing is optionally achieved by having the cross-sectional area of the control element 26 be larger than the cross-sectional area of the storage element 24.

Figure 4:
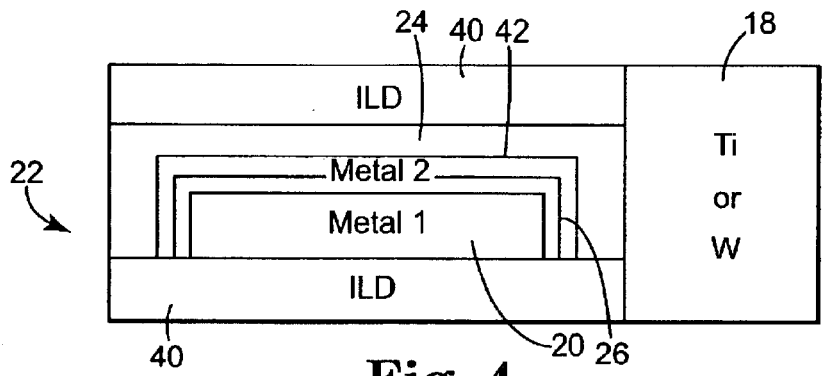
FIG. 4 shows a FIG. 3 memory cell according to an embodiment of the invention.
Figure 5:
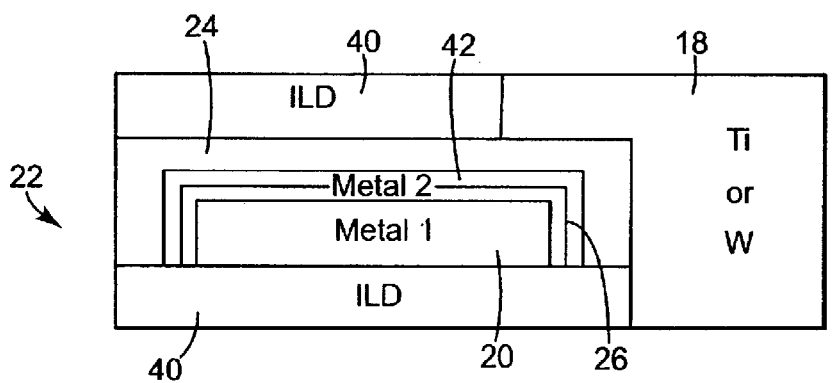
FIG. 5 shows a FIG. 3 memory cell according to an embodiment of the invention.
Figure 6:
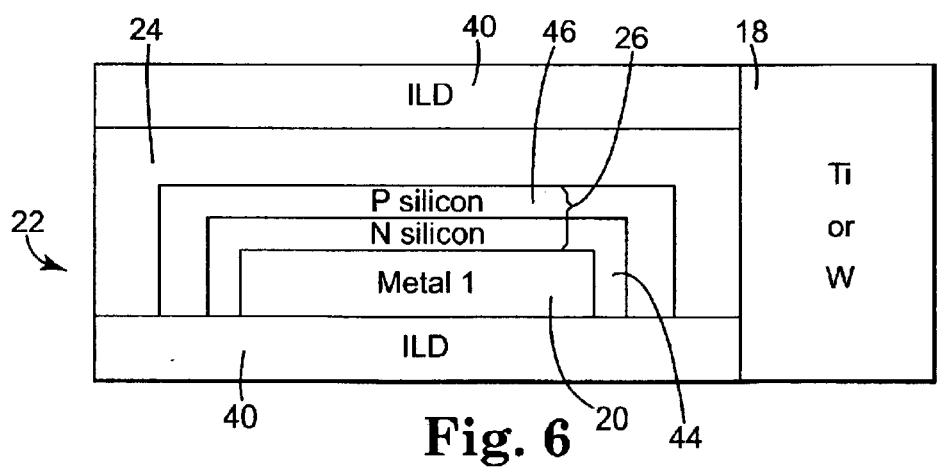
FIG. 6 shows a FIG. 3 memory cell according to an embodiment of the invention.

FIGS. 4–6 are illustrations of embodiments enabling fabrication of a memory cell 22 used in a cubic memory array. FIG. 4 illustrates a first embodiment of a memory cell 22 that shows bit-line 18 as a column of material made of e.g. titanium (Ti) or tungsten (W) deposited e.g. after the control element 26 and phase-change storage element 24 are formed. The phase-change material of storage element 24, e.g. chalcogenide, is deposited directly onto middle electrode 42, according to this embodiment.

Bit-line 18 is disposed next to an insulating layer of dielectric material (inter-layer dielectric or ILD) 40. Various materials optionally are used for ILD 40, including silicon dioxide, silicon nitride, oxynitrides, and tetraethylorthosilicate (TEOS), to name a few. The ILD optionally is deposited using one or more of several different technologies such as chemical vapor deposition (CVD), atmospheric pressure CVD, low pressure CVD, plasma-enhanced CVD, physical vapor deposition (PVD), and/or sputtering. The ILD may be planarized using processes such as chemical mechanical polishing (CMP). ILD 40 is used throughout this specification to indicate dielectric filler material on one or more layers. The actual dielectric material optionally is composed of one or more of the aforementioned materials.

Disposed on the ILD 40 is a word-line 20 formed of e.g. a conductive thin-film shown as metal 1, for instance, aluminum. The word-line 20 is oxidized, either self-oxidized, thermally grown, or has a deposited oxide. The oxide is optionally formed over the entire exposed portion of the word-line 20, optionally over its entire length. The thickness of the oxide may be less than about 100 Angstroms, and particularly less than about 20 Angstroms. Over a portion of the oxide, another conductive thin-film, shown as metal 2 (e.g. aluminum), is deposited and patterned to form control element 26, optionally a tunnel junction device with metal 1 and metal 2 as its electrodes. Metal 2 is also called a middle electrode 42 as it is formed electrically between the word-line 20 and the bit-line 18. Phase-change material such as chalcogenide is deposited onto the middle electrode 42 to form the storage element 24. Disposed on element 24 is another layer of ILD 40. A via is etched in ILD 40 to locate the vertical pillar. Finally, the titanium, tungsten or other material is deposited to form the bit-line 18, which contacts storage element 24 with the middle electrode 42 and the bit-line 18 as the corresponding electrodes.

In some embodiments, the metal 1 (20) has an oxide layer (alumina ($Al_2O_3$) in the case of an aluminum (Al) conductor) that is fabricated directly on the top exposed surface of the entire metal 1. The metal 1 (20) and metal 2 (42) may be formed of aluminum, copper, or silicide and/or alloys thereof, although other conductive metals or semi-conductors may be used. The oxide layer interfacing with metal 1 and metal 2 forms the control element 26. The fabrication of the oxide layer is optionally performed after metal 1 has been etched, to enable coverage over the sidewalls. A tunnel junction control element is optionally formed by a metal/oxide/metal interface.

Appropriate row and column lines are selected to force a current through a selected memory cell. The current passing through the selected memory cell creates Joule heat that triggers and completes the silicidation reaction. By using the concentrated electric field created by embodiments of the invention, current is focused and thus the Joule heat is concentrated in a smaller area thereby enabling the programming to be completed in less time than without embodiments of the invention. The silicidation reaction causes the resistance of the selected memory cell to change to a much lower value. To read the programmed memory cell, a small sense current is supplied to a selected memory cell and the voltage drop across the selected memory cell is sensed. Example silicide compounds are $Ni_2Si$, $NiSi$, $NiSi_2$, $Pd_2Si$, $PdSi$, and $Pt_2Si$, and $PtSi$. Other possible transition metals in various compounds with silicon include Ti, V, Cr, Mn, Fe, Co, Zr, Nb, Mo, Rh, Hf, Ta, W, and Ir.

FIG. 5 shows an alternative embodiment to that of FIG. 4 but includes an extended contact surface between bit-line 18 and phase-change storage element 24. In this embodiment, an ILD 40 is placed down on a surface adjacent and abutting the bit-line 18, e.g. made of titanium (Ti) or tungsten (W).

Otherwise, the construction of the memory cell in FIG. 5 is similar to that described for FIG. 4.

FIG. 6 shows another embodiment of the memory cell 22 in which the control element 26 is formed of a pn junction diode. In this embodiment, an ILD 40 is placed on a surface and a first metal, such as aluminum, is deposited and patterned to create the word-line 20. A layer of n silicon 44 is then deposited over the word-line 20. A subsequent layer of p silicon 46 is then deposited over the n silicon 44. The combined silicon is then patterned and etched to create the control element 26. Phase-change storage element 24 is then deposited or otherwise applied on the layer of p silicon 46. ILD 40 is deposited or otherwise applied on phase-change storage element 24. A via is etched in ILD 40 to locate the vertical bit-line 18. The vertical bit-line 18 is then deposited. The storage element 24 has the layer of p silicon 46 and the bit-line 18 as electrodes.

Figure 7:
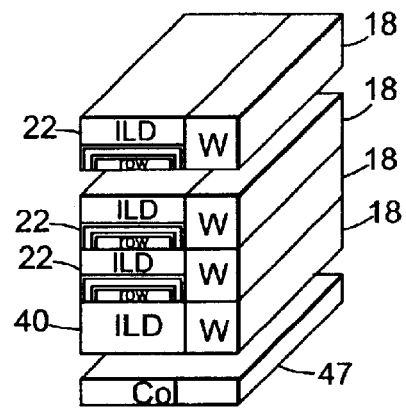
FIG. 7 is a partially-exploded view of one vertical pillar column and multiple row-lines, according to an embodiment of the invention.

FIG. 7 is a partially-exploded view of one vertical bit-line and three horizontal word-lines for one embodiment of the invention illustrating how a vertical bit-line interfaces with planar select-lines. In this embodiment, a traditional horizontal column select-line 47 is disposed parallel to the surface on a substrate of material, such as a processed semiconductor wafer. An interface layer of ILD 40 is deposited on the horizontal column select-line 47. A vertical bit-line 18 is formed next to the ILD 40 and contacts the horizontal column select-line 47. Then a memory cell 22, such as any of those shown in FIGS. 4–6 or other possible implementations, is disposed on the ILD 40. A vertical bit-line 18 is then formed on the previous vertical bit-line 18 to create the vertical pillar. Second and third memory cells 22 are deposited on the previous memory cell 22 and the vertical bit-lines 18 are deposited on the previous vertical bit-line 18 to extend the vertical pillar.

Figure 8:
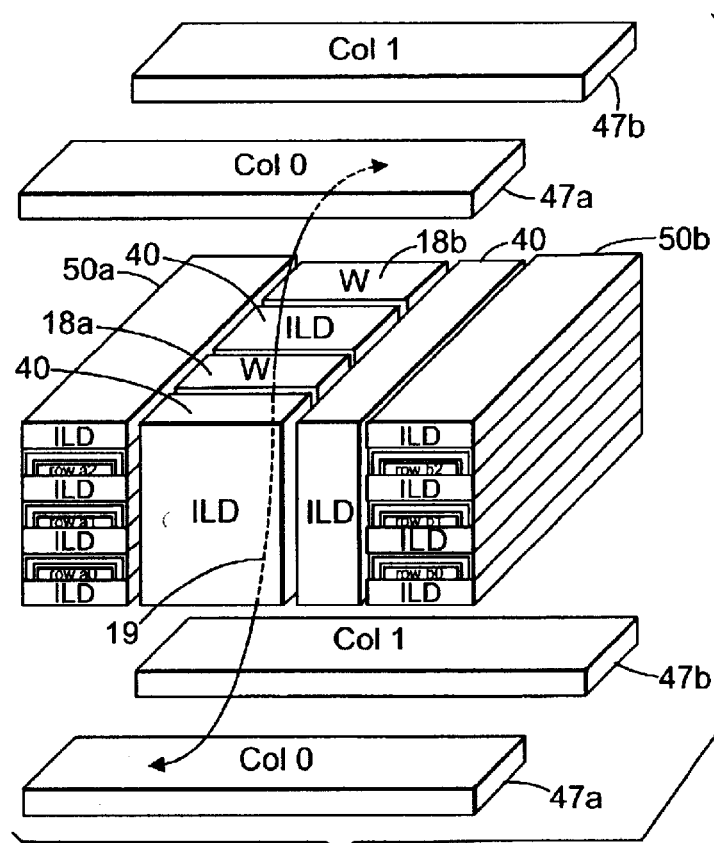
FIG. 8 is a partially-exploded view showing a current loop path connection, according to an embodiment of the invention.
Figure 9:
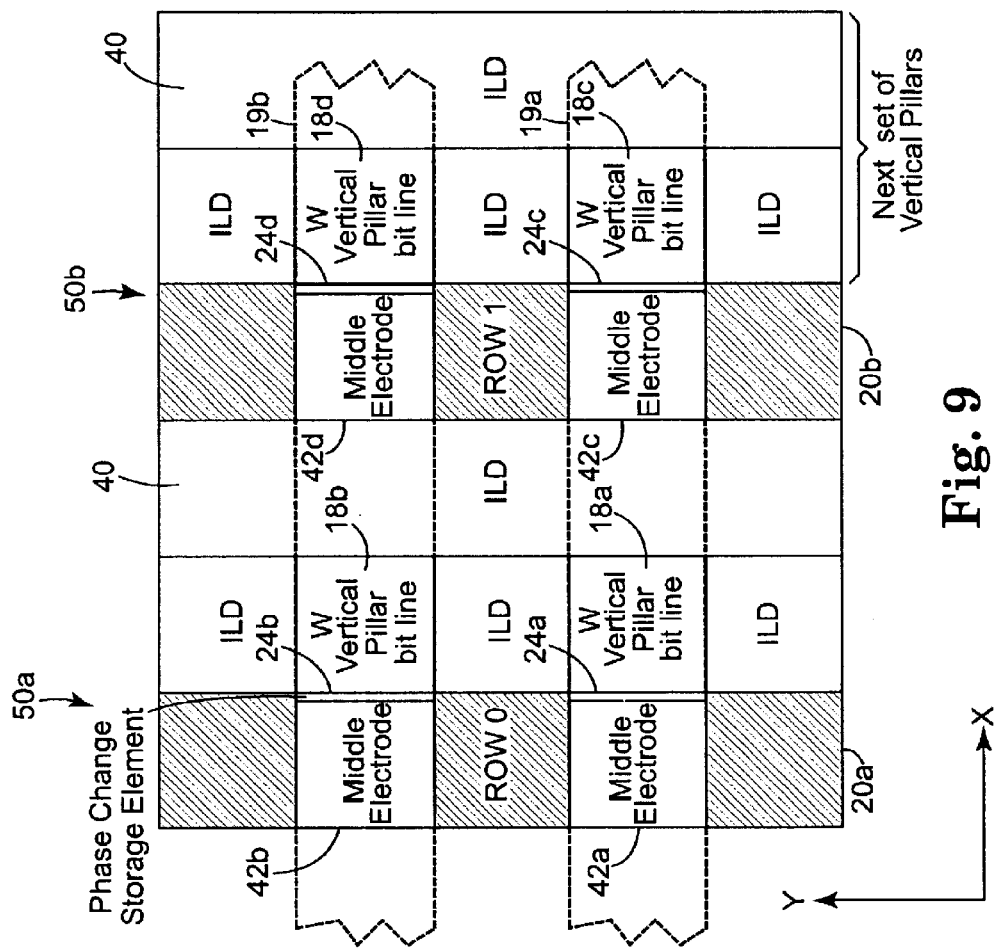
FIG. 9 is a top view of the FIG. 8 embodiment, with elements omitted for clarity.

FIGS. 8 and 9 demonstrate how the cubic array of memory is expanded as desired to increase the number of memory storage elements. FIG. 8 is a partially-exploded view of the components and layers of the cubic memory array. FIG. 9 is a top view of the array shown in FIG. 8, with bit-lines 47a, 47b omitted for clarity. In FIG. 8, a substrate surface includes one or more horizontal bit-lines such as 47a and 47b, here representing column 0 and column 1 of a memory array. On the horizontal bit-lines 47a and 47b is one or more sets of memory cells, such as 50a and 50b. The various horizontal row-lines are insulated from contact with adjacent horizontal row-lines by various layers of ILD 40. The vertical bit-lines 18a and 18b are positioned, deposited on, and make contact to the respective horizontal bit-lines 47a and 47b. An ILD 40 dielectric layer also separates the adjacent vertical bit-lines 18a and 18b. Current path 19, which represents a current loop or connection, extends, as shown, through vertical bit-line 18a between horizontal bit-lines 47a, 47a, to heat vertical bit-line 18a and erase or reset phase-change storage elements 24 associated with bit-line 18a, as previously described. The vertical bit-lines 18a and 18b make contact to an oxide layer formed on middle electrodes 42a–d (see FIG. 9). The middle electrodes are separated from the horizontal row-lines 20a–b (FIG. 9) by a control element, e.g., a tunnel junction device or diode in memory cell 22. Particular bit-lines 18a–18d optionally are selected using current loop path connection 19 (FIG. 8) and associated control logic for controlling the state of respective associated phase-change storage elements 24a–24d.

FIG. 9 also shows how an additional set of vertical pillar select-lines is placed adjacent to the second set of memory cells 50b to continue to extend the array. Adjacent to the additional set of vertical pillars is another ILD 40 to provide isolation for another set of memory cells.

Figure 10:
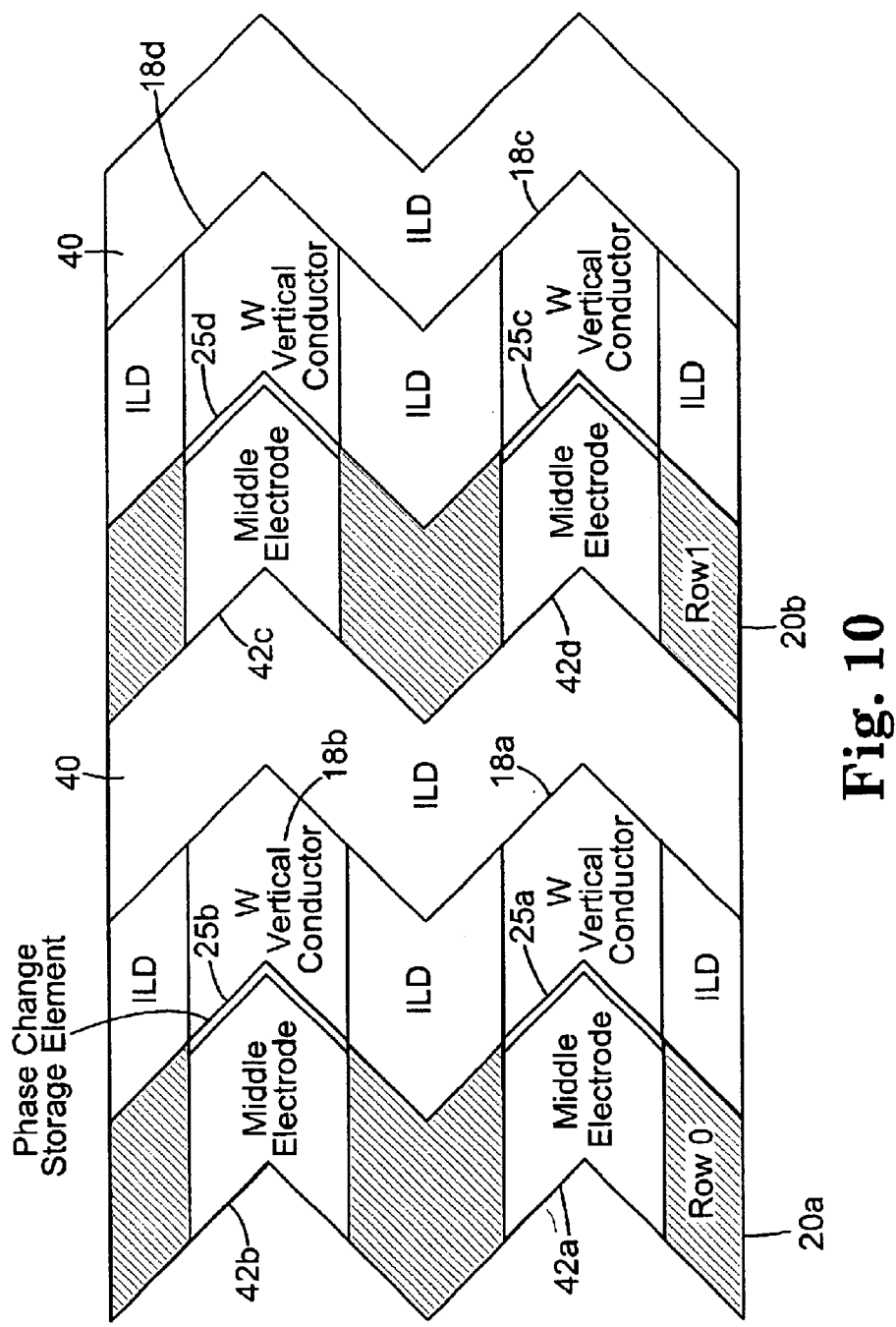
FIG. 10 is a top view showing a serpentine layout, according to an embodiment of the invention.

FIG. 10 is an alternative embodiment of the cubic memory array in which the horizontal word-lines 20a and 20b are formed in a serpentine manner to create angled phase-change storage elements 25a–d. These angles in the serpentine row-lines create enhanced electrical fields to lower the programming power, voltage, current, and time required to program the angled storage elements 25a–d.

Figure 11:
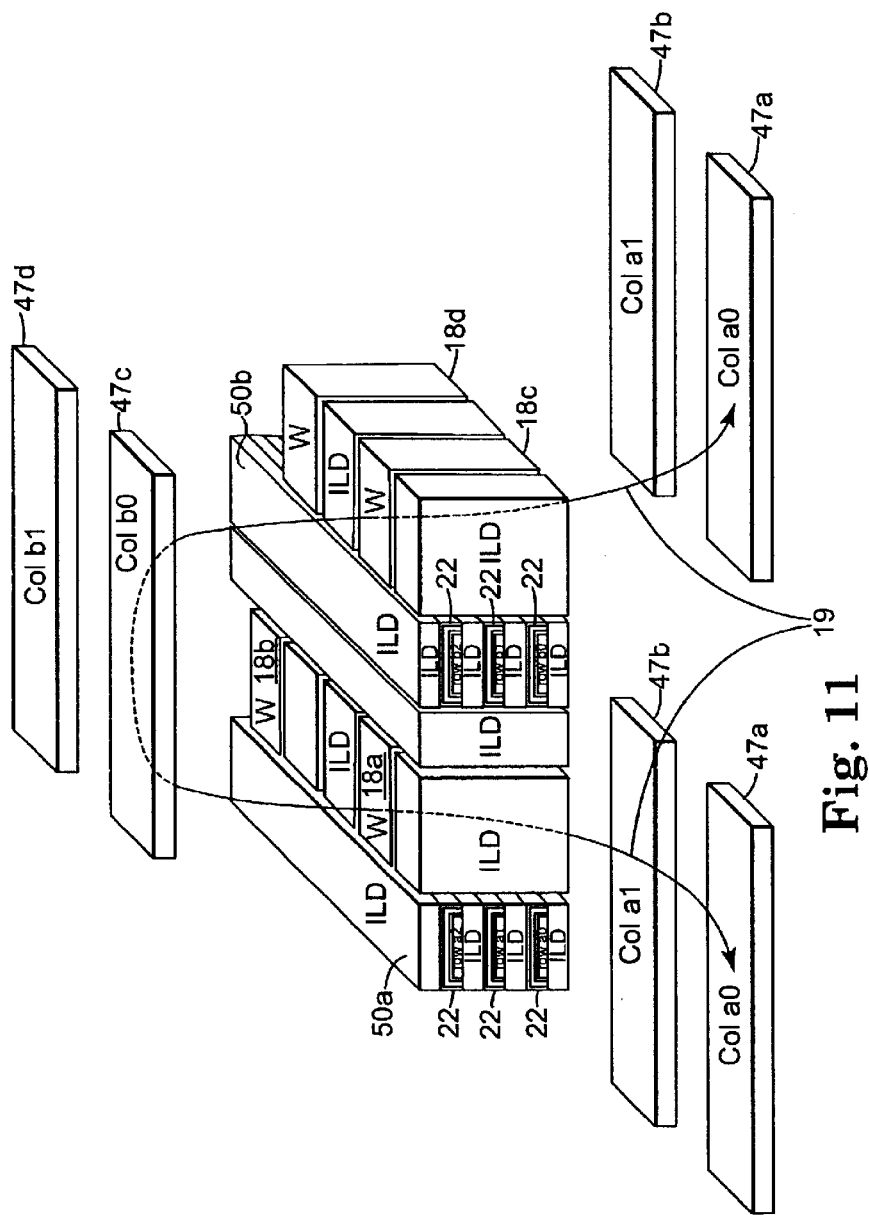
FIG. 11 is a partially-exploded view showing a current loop path connection, according to an embodiment of the invention.

FIG. 11 is a partially-exploded view of an alternative embodiment of the invention. In this embodiment, a first set of memory cells 50a forms an intersection with vertical pillars bit-lines 18a and 18b. A second set of memory cells 50b is isolated from the first set of memory cells 50a and vertical pillars 18a and 18b by an optional ILD. The second set of memory cells 50b forms an intersection with vertical pillar bit-lines 18c and 18d. Vertical pillar bit-lines 18a and 18c make electrical contact with horizontal bit-line 47a. Vertical pillar bit-lines 18b and 18d make electrical contact with horizontal bit-line 47b. Current loop path connection 19 extends from horizontal bit-line 47a, through vertical pillar bit-line 18a to horizontal bit-line 47c, and then through vertical pillar bit-line 18c to horizontal bit-line 47a. Pillars 18a and 18c thus are connected in a continuous current path for erasing or resetting memory cells 32 associated with them, as referenced previously. Any number of columns optionally are connected in a continuous current path as directed by the associated control. Additionally, multiple different continuous current paths optionally are provided to join multiple different columns, again as directed by the associated control.

This figure illustrates three levels of memory cells 22 stacked upon one another vertically. Depending on the particular fabrication processes used, it may be difficult to keep extending the vertically stacked layers of memory cells 22 due to non-planarity of the previously fabricated surface. Therefore, one approach to enabling additional height is to create a layer of ILD (insulating layer of dielectric material) (not shown) on top of the formed layers of memory cells. This layer of ILD is then planarized such as with chemical mechanical polishing (CMP) or other known planarization techniques to form a new planar substrate on which horizontal bit-lines 47c and 47d are disposed. Further processing of adding additional sets of memory cells on the horizontal bit-lines 47c–d enables extending the vertical dimension of the cubic memory array.

According to embodiments of the invention, a memory array comprises substrate 10, a plurality of first select-lines 20 disposed in more than one plane generally parallel to substrate 10, a plurality of second select-lines formed in pillars 18 disposed generally orthogonal to substrate 10, a plurality of memory cells 22 coupled to the first select-lines 20 and the second select-lines 18, and a current path connection 19 providing a continuous current path through a selected plurality of pillars 18 to heat the selected pillars and cause memory cells 22 associated with the selected pillars 18 to be reset. The memory cells are optionally rewritable memory cells, and each may comprise a phase-change storage element 24, such as a chalcogenide material. Control logic is provided e.g. in substrate 10 for selecting ends of the continuous current path 19 to determine the selected pillars 18. Continuous current path 19 enables multiple memory cells 22 to be reset generally simultaneously. Each memory cell 22 optionally comprises a control element 26 in series with memory storage element 24.

Other embodiments of the invention provide a memory, comprising a plurality of select-lines 18, 20, a plurality of memory cells 22 associated with the select-lines, and means for directing electrical current along a single path 19 through chosen select-lines so as to change the state of memory cells 22 associated with the chosen select-lines. Memory cells 22 comprise phase-change storage elements 24 that change phase upon heating. The means for directing electrical current heats the chosen select-lines. CMOS logic, optionally provided in substrate 10, is used for determining which of the plurality of select-lines is chosen.

Figure 12:
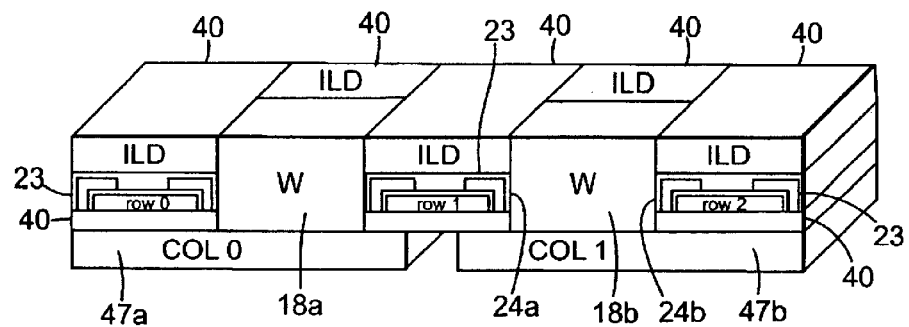
FIG. 12 is a perspective view of a dual memory cell, according to an embodiment of the invention.

FIG. 12 is a perspective view of another embodiment that increases volumetric efficiency when using antifuse storage elements by eliminating the spacer ILD 40 used to separate the next adjacent horizontal word-lines from the present set of vertical pillar bit-lines. In this embodiment, a dual memory cell 23 is disposed directly between two vertical pillar bit-lines 18a, 18b forming storage elements 24a and 24b, respectively. Although two storage elements are formed, only one storage element optionally is used in a memory array. The other storage element is left unprogrammed (open circuited for an antifuse) and optionally provides only an additional capacitive load. Thus more than one storage element contacts the vertical pillar on a particular level; however only one storage element is actually used according to this embodiment.

Figure 13:
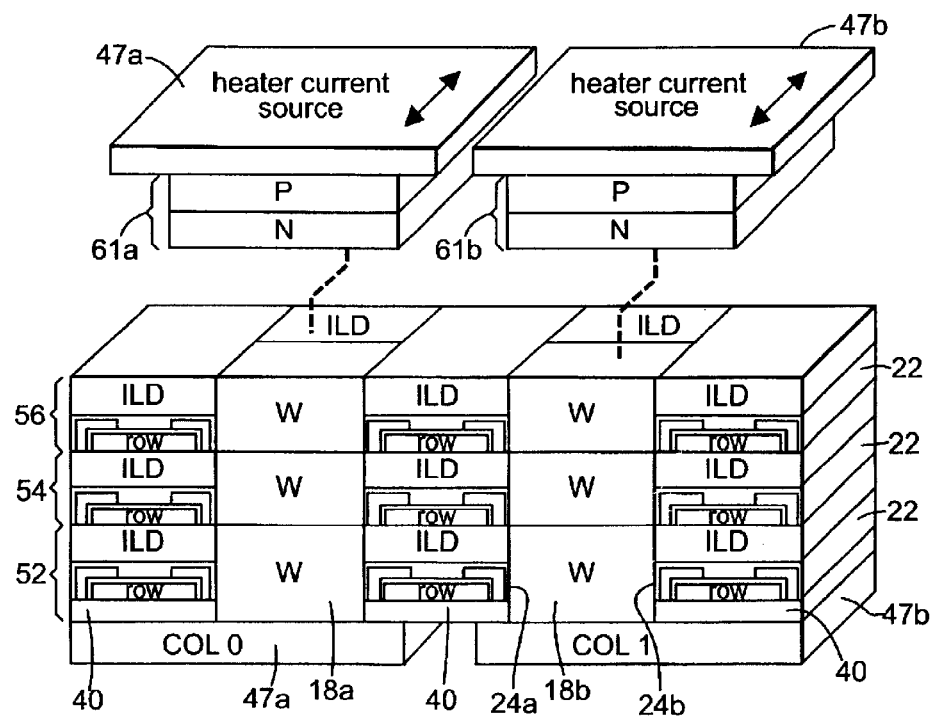
FIG. 13 is a perspective view showing multiple layers of memory cells, according to an embodiment of the invention.

FIG. 13 is a perspective view of a stacked implementation of the alternative embodiment shown in FIG. 12. In this embodiment, a first level 52 is disposed on a horizontal bit-lines 47a and 47b. Optionally, depending on the process used, the first level 52 is disposed on the surface of the substrate, and the horizontal bit-lines 47a and 47b are attached to the top of the vertical pillars 18a and 18b, respectively, via pn diodes 61a, 61b. Diodes 61a, 61b are used as switches to direct current through one or more specific pillars 18a, 18b for erasing or resetting one or more memory cells 22, e.g. generally simultaneously. The vertical pillar bit-lines 18a, 18b are electrically coupled to and contact the horizontal bit-lines 47a, 47b, respectively, which together with diodes 61a, 61b act as heater current sources.

FIG. 13 shows heater current sources for vertical pillars having memory cells on both sides. The heater current source lines are generally orthogonal to the column lines and generally parallel with the row-lines. A second level of memory cells 54 is disposed on the first level of memory cells 52. A third level of memory cells 56 is disposed on the second level of memory cells 54. The vertical pillars 18a and 18b are optionally formed using titanium (Ti) or tungsten (W), although other metal conductors may be used. Storage elements 24a and 24b are shown contacting a single vertical pillar, thus sharing the column select signal and/or both being erased or reset upon heating of the pillar using continuous current path connection 19. Multiple current path loops optionally are activated concurrently to realize a block erase function.

Figure 14:
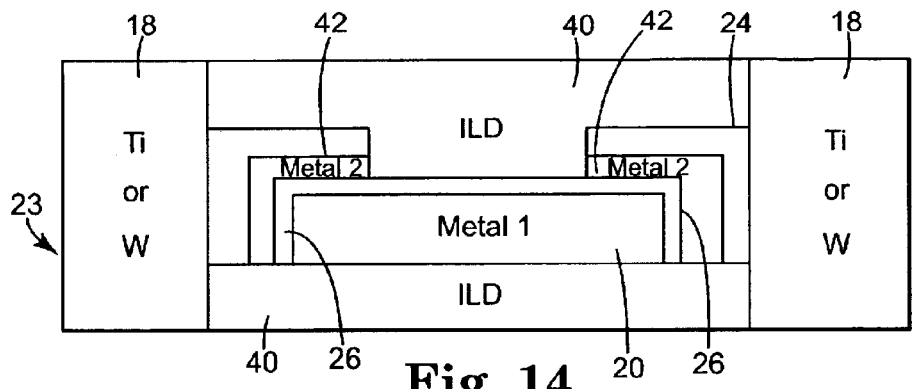
FIG. 14 shows dual memory cells, according to an embodiment of the invention.
Figure 15:
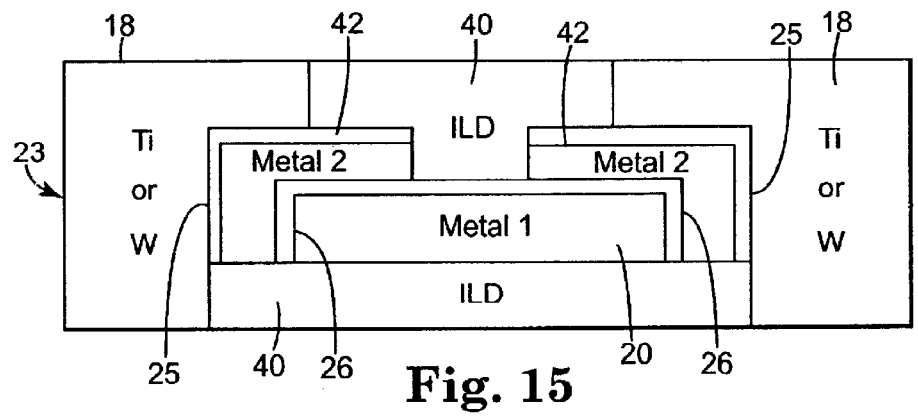
FIG. 15 shows dual memory cells, according to an embodiment of the invention.
Figure 16:
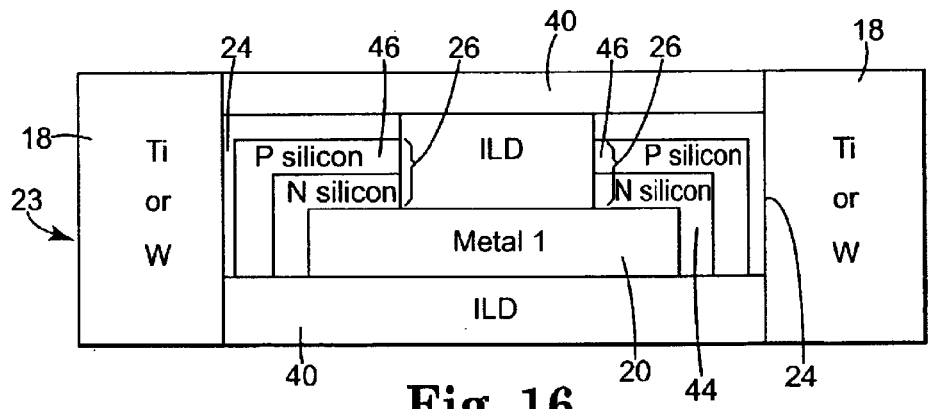
FIG. 16 shows dual memory cells, according to an embodiment of the invention.

FIGS. 14–16 are example embodiments of a dual memory cell 23 used when the vertical pillars contact more than one memory cell per layer. For instance, FIG. 14 illustrates a first embodiment of a dual memory cell 23 that shows bit-line 18 as a column of material made of, for example, titanium (Ti) or tungsten (W) that is deposited e.g. after the control element 26 and phase-change storage element 24 are formed. This bit-line 18 is disposed next to an insulating layer of dielectric material (ILD) 40. Various materials optionally are used for ILD 40, as described previously with respect e.g. to FIGS. 4–6.

FIG. 15 shows an alternative embodiment of dual memory cell 23 to that shown in FIG. 14 but which includes extended angled storage elements 25 formed of phase-change material. In this embodiment, an ILD 40 is placed down on a surface adjacent and abutting the bit-line 18, made of e.g. titanium (Ti) or tungsten (W). When the bit-line 18 is deposited, it forms a contact surface over the angled storage element 25. By having an angled storage element, the electric field produced when a voltage is applied between the middle electrode 42 and the bit-line 18 is enhanced, thereby enabling a lower programming voltage. Other aspects of the memory cell in FIG. 15 are similar to those described for FIG. 14.

FIG. 16 shows another embodiment of dual memory cell 23 in which the control elements 26 are formed of pn junction diodes. In this embodiment, an ILD 40 is placed on a surface and a first metal, such as aluminum, is deposited and patterned to create the word-line 20. A layer of n silicon 44 is then deposited over the word-line 20. A subsequent layer of p silicon 46 is then deposited over the n silicon 44. The combined silicon is then patterned and etched to create two control elements 26. Phase-change material such as a chalcogenide is deposited onto the middle electrode 42 to form storage elements 24. An ILD 40 is deposited or otherwise applied on the layer of p silicon 46. A via is etched in ILD 40 to locate the vertical bit-line 18. Vertical bit-lines 18 are then deposited. The storage elements 24 have the layers of p silicon 46 and the bit-lines 18 as electrodes and the oxide layer as the anti-fusible material. Other aspects of the FIG. 16 embodiment are similar to those described with respect to FIGS. 14–15.

Figure 17:
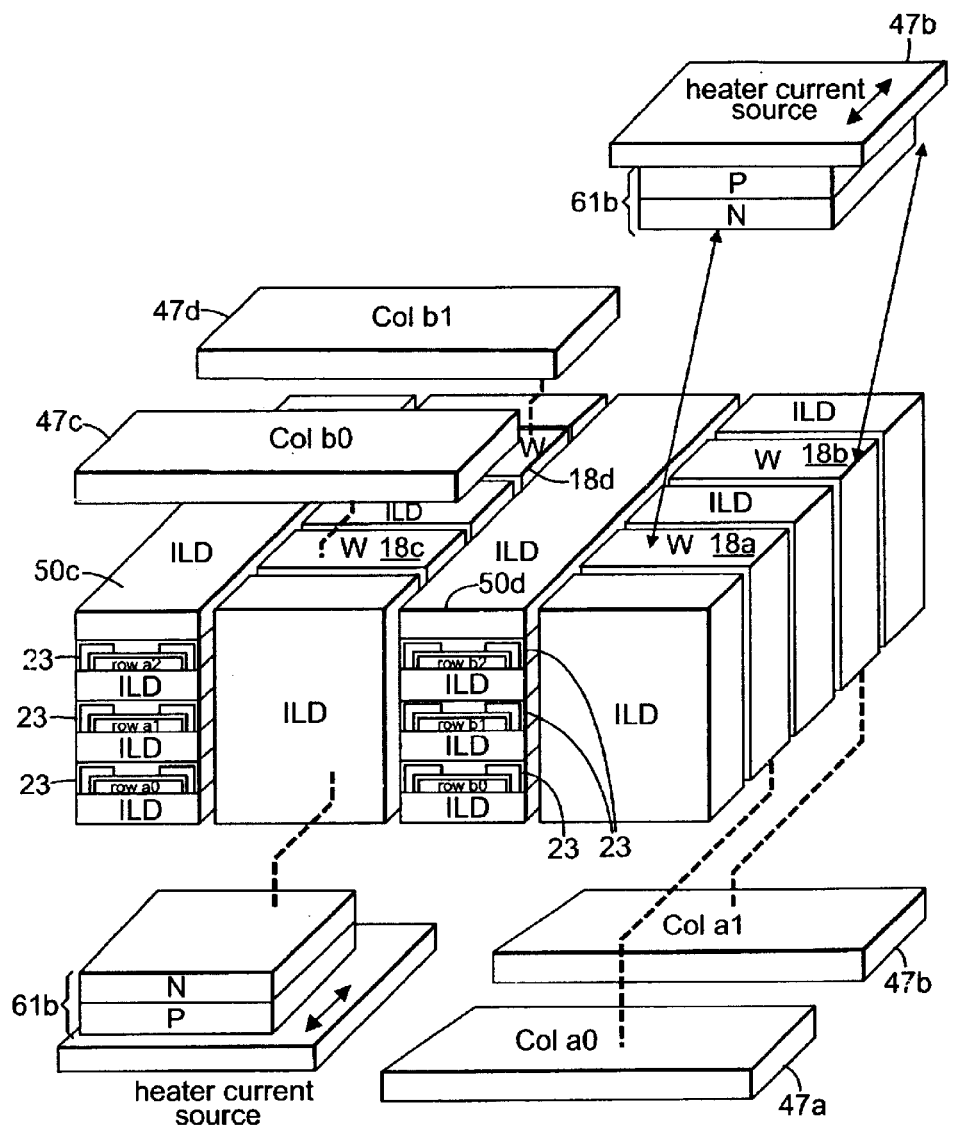
FIG. 17 shows a memory array including structure shown in FIG. 12, according to an embodiment of the invention.

FIG. 17 is a partially-exploded view of an embodiment of a three-dimensional memory array that incorporates the basic dual memory cell 23 shown in FIGS. 12–13. In this embodiment, horizontal bit-lines 47a and 47b are formed within a substrate surface that defines a plane. Sets of memory cells 50c–d that are formed in planes parallel to the plane of the substrate are disposed on the substrate. Vertical bit-lines 18a–18d are formed in planes that are perpendicular to the plane of the substrate. The vertical bit-lines 18a–d are adjacent to and make contact with the storage elements in the respective adjacent set of memory cells 50c–d. Optionally, the cubic memory array is extended by adding an ILD layer (not shown) on the set of memory cells and planarizing it to form a new substrate surface. On this planar surface, another set of horizontal bit-lines 47c and 47d are disposed and are connected by vias into the top ILD layer to the respective vertical pillars 18c and 18d. Further sets of memory cells and vertical bit-lines are optionally built upon the additional substrate surface. Because there is no ILD separating a vertical bit-line from adjacent sets of memory cells, each vertical bit-line is in contact with two storage elements per horizontal layer. Heater current sources with e.g. pn diodes 61b are connected to respective pillars 18, as shown and as described previously.

Figure 18:
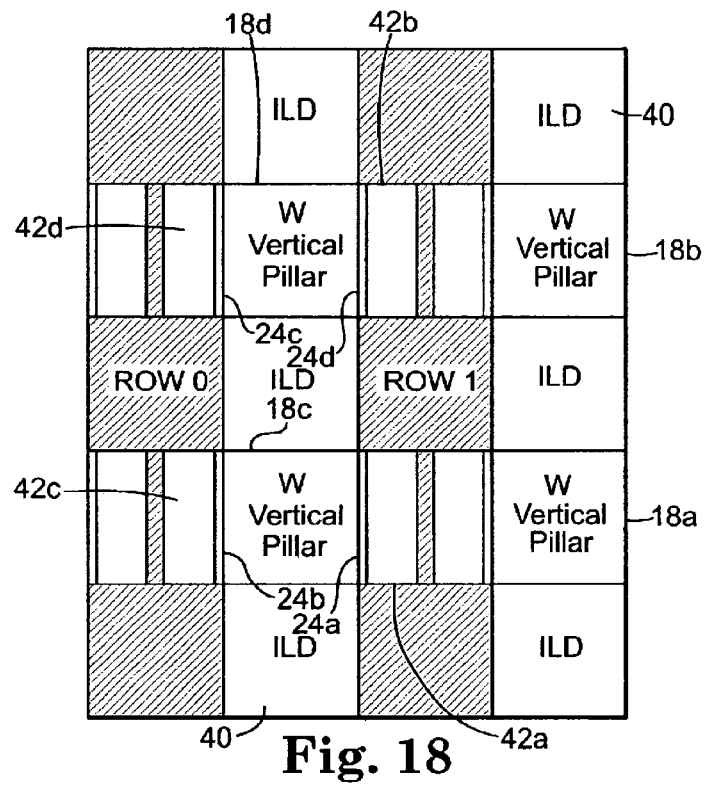
FIG. 18 is a top view of the FIG. 17 embodiment, with elements omitted for clarity.

FIG. 18 is a top view of the FIG. 17 embodiment, showing the double memory cells and with the upper bit-lines and heater current source omitted for clarity. In this embodiment, the middle electrodes 42c and 42d contact the vertical pillar bit-lines 18c and 18d, respectively, forming memory storage elements 24b and 24c. In addition, because there is no ILD 40 separating the next set of middle electrodes 42a and 42b from the vertical pillar bit-lines 18a and 18b, respectively, a second set of memory storage elements 24a and 24d is formed.

Figure 19:
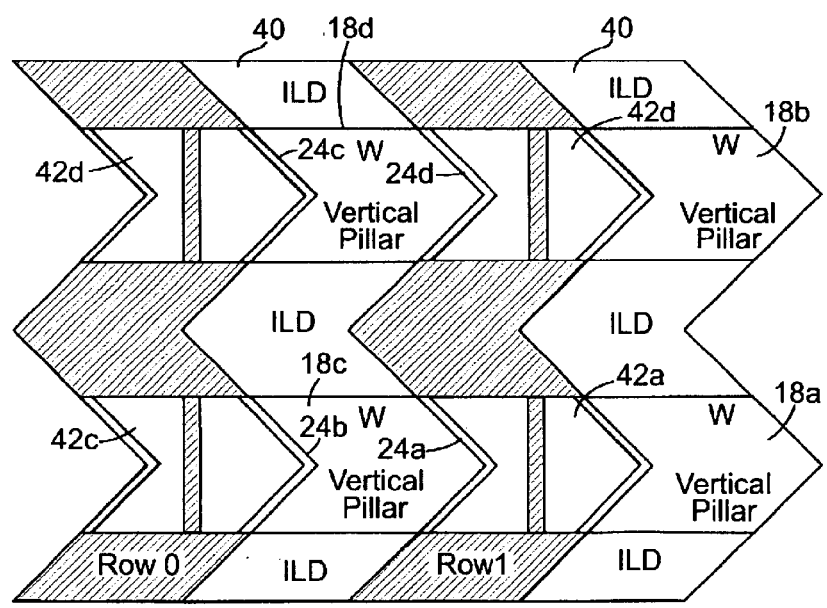
FIG. 19 is a top view showing a serpentine layout, according to an embodiment of the invention.

FIG. 19 is a top view of an alternative embodiment of that shown in FIG. 18 in which serpentine horizontal word-lines are used to enhance electric fields to lower the programming power, voltage, current and time of the memory cells that are actually programmed. By having two edges form a point or corner, the electric field is increased for a given voltage potential between the middle electrodes 42 (42a–42d) and the vertical pillar bit-lines 18 (18a–18d).

Figure 20:
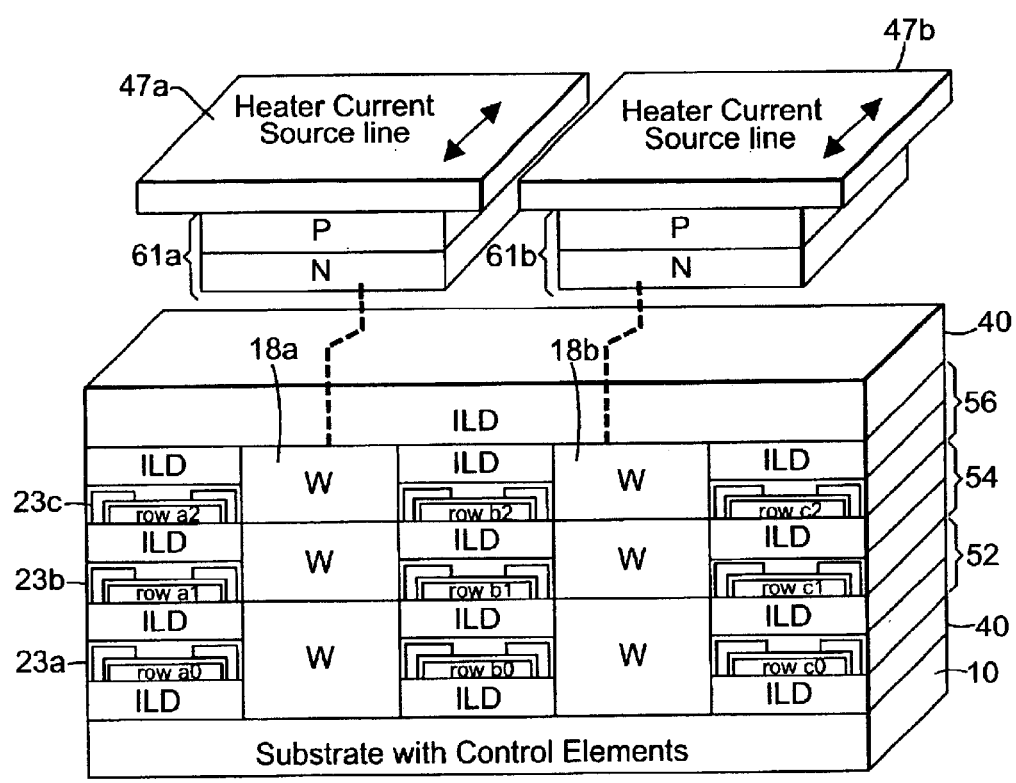
FIG. 20 is a partially-exploded view according to an embodiment of the invention.
Figure 21:
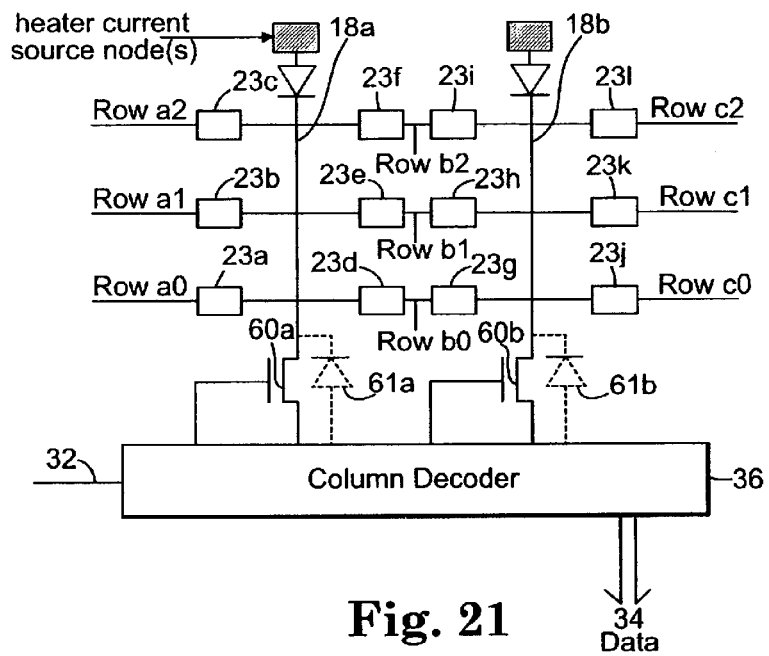
FIG. 21 is a partial schematic showing dual memory cells, according to an embodiment of the invention.

In the embodiment of FIG. 20, rather than routing the bit-lines select signals using horizontal bit-lines to the vertical pillar bit-lines 18a and 18b, the vertical pillar bit-lines 18a and 18b make contact with the substrate 10, directly to control transistors (see 60a and 60b in FIG. 21, for example). The control transistors are fabricated on the substrate using e.g. semiconductor processing and may be implemented in various technologies, for example, field effect transistors (FET). Alternatively, the control transistors optionally are supplemented or replaced with other control elements, such as diodes. The control transistors and/or diodes optionally are disposed substantially beneath or adjacent to the vertical pillar bit-lines 18a–b. By having the transistors and/or diodes distributed beneath the vertical pillar bit-lines 18a, 18b respectively, increased sensing speed is achieved by reducing capacitive loading on the sense lines. Memory cells 23a, 23b, 23c are stacked upon one another in first level 52, second level 54, and third level 56, respectively. An ILD 40 is placed over the last level, third level 56 in this example, to act as a passivation layer or as a planar surface on which to build additional layers. The cubic array also optionally is formed on a substrate that is not necessarily a semiconductor substrate.

FIG. 20 also illustrates diodes 61a and 61b, optionally formed after the vertical pillars 18a and 18b are formed. The diodes 61a and 61b are formed using e.g. a ramped doped silicon deposition processor other process. After the diodes 61a and 61b are formed, an ILD layer (not shown) optionally is deposited between the diodes 61a and 61b before depositing the horizontal bit-lines 47a and 47b. The diodes 61a and 61b optionally are electrically connected to one or more vertical pillars, thus enabling shared diodes. The diodes 61a and 61b are sized appropriately to provide adequate current during programming without causing failure. Diodes 61a, 61b are connected to heater current source lines 47a, 47b and function to control heater current through columns 18a, 18b for resetting memory cells 22, as described previously.

FIG. 21 shows a partial schematic of the antifuse connection to the word-lines and bit-lines of the word-line 38 and column 36 decoders (see FIG. 1). Rows a0-2, b0-2, and c0-2 are outputs from the word-line decoder 38 (not shown in this figure, but see FIG. 1) and couple to dual memory cells 23a–23l. Vertical pillar bit-lines 18a, 18b connect to a switching element such as sense transistors 60a and 60b (or alternatively diodes 61a and 61b), respectively which are controlled and input into the column decoder 36. Based on the contents of the inputs of address lines 32 coupled into the column decoder 36, the sensed data is output on data bus 34. Heater current source nodes are disposed as indicated for controlling heater current in columns 18a, 18b to reset or erase the contents of associated memory cells, as described previously.

Figure 22:
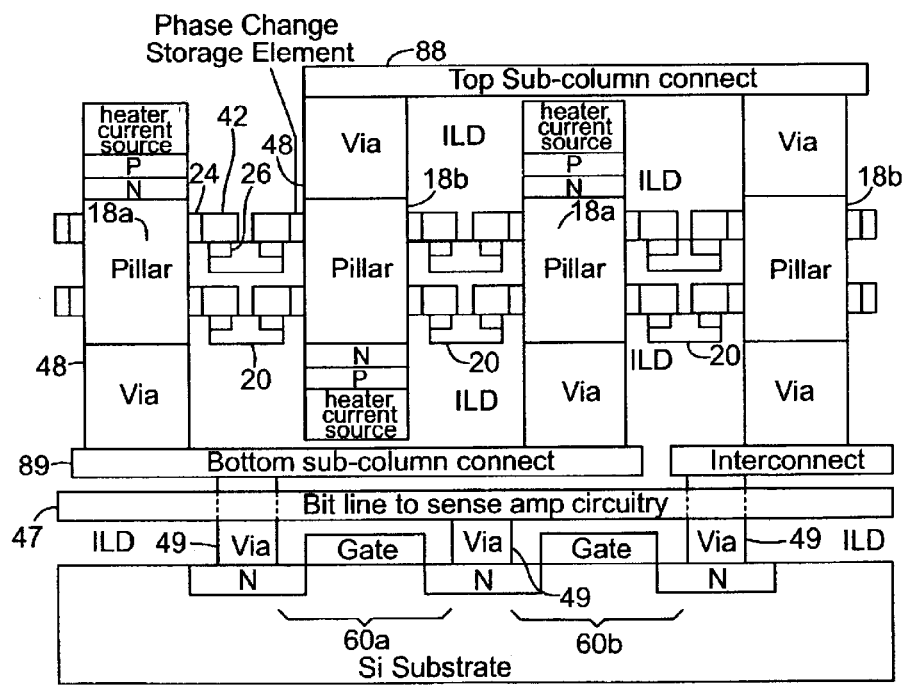
FIG. 22 is a side view according to an embodiment of the invention.

FIG. 22 is a sectional view of an alternative embodiment of the invention in which the vertical pillar select-lines 18a and 18b are formed in more than one pillar and interconnected by top sub-column connect 88 and bottom sub-column connect 89. The top 88 and bottom 89 sub-column drive connects couple to the vertical pillars 18a and 18b through vias 48. Because the vertical pillars 18a and 18b short the memory storage elements 24 on the respective sides of the pillar, only one storage element 24 per pillar is accessed at one time. Therefore, every other pillar is connected to a sub-column connect line. Each memory cell has a storage element 24 in series with a control element 26 that are coupled in series through a middle electrode 42. The vertical pillar 18a or vertical pillar 18b are interconnected to a horizontal single bit-line 47 that is connected to the sense amp circuitry in the column decoder 36 of FIG. 1. This interconnection is achieved by enabling one of transistors 60a or 60b to select the desired vertical pillar 18a and 18b. Vias 49 provide connections to/from bottom sub-column connect 89, bit-line 47, the substrate, and an interconnect to pillar 18b, in the manner shown. FIG. 22 also illustrates heater current sources with pn diodes, which are associated with vertical pillars 18a and function as previously described.

Thus, a memory according to embodiments of the invention includes substrate 10, a plurality of first select-lines 20 disposed in more than one plane generally parallel to substrate 10, a plurality of second select-lines 18 formed in pillars disposed generally orthogonal to the substrate 10, a plurality of memory cells 22 coupled to the first select-lines 20 and the second select-lines 18, and a plurality of heater current sources 47a, 61a, 47b, 61b for directing current through chosen second select-lines 18, the heater current sources including one or more of the first select-lines. The heater current sources comprise switches for directing current through the chosen second select-lines. The switches optionally comprise diodes 61a, 61b, e.g. pn diodes.

Figure 23:
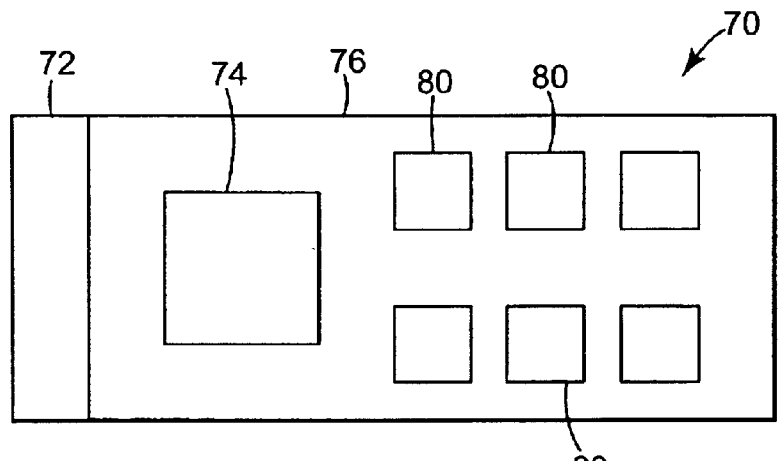
FIG. 23 shows a memory carrier according to an embodiment of the invention.

FIG. 23 is an example layout of a memory carrier 70 that incorporates at least one embodiment of the invention. The memory carrier represents any of several standard or proprietary memory card formats, such as a personal computer memory card international association (PCMCIA) card, personal computer (PC) card, Smart memory, memory stick, digital film, advanced technology attachment (ATA), and compact flash, to name a few. The memory carrier includes a mechanical interface 72 that provides for both mechanical and electrical contact with a particular connector for the type of memory carrier standard implemented. An optional electrical interface 74 makes electrical coupling with the electrical contacts on the mechanical connector 72 and provides the proper security, address decoding, voltage translation, write protection, or other interface functions with a set of memory ICs 80 that incorporate at least one memory array according to embodiment of the invention. A carrier 76, for example a printed circuit board or ceramic substrate, is used to physically support the memory ICs 80, electrical interface 74, and mechanical interface 72. It will be appreciated to those of skill in the art that some electrical devices optionally incorporate the functionality of electrical interface 74 thereby obviating its need in memory carrier 70. The set of memory ICs 80 optionally includes one or more devices. Further, there may be more than one type of memory array, such as an OTP memory IC and read-writeable memory ICs, for memory ICs 80.

Figure 24:
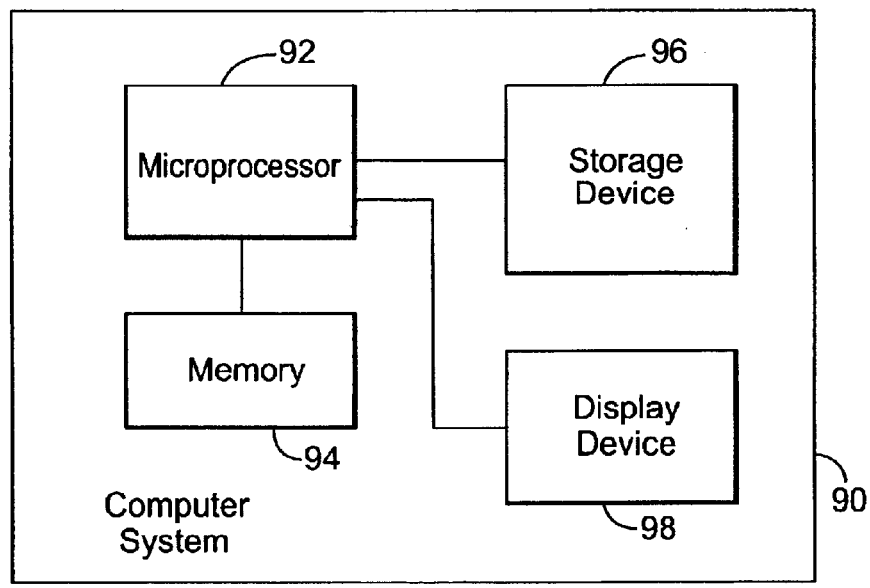
FIG. 24 is a block diagram of an electronic device according to an embodiment of the invention.

FIG. 24 is a block diagram of an electronic device, in this example a computer system 90, which incorporates at least one embodiment of the invention. In particular, for a computer system, several different electrical devices as shown optionally are incorporated into the package. Here a microprocessor 92 is coupled to a memory circuit 94 used to hold computer executable instructions and/or user data. Example memory circuits 94 include basic input/output system (BIOS) memory, dynamic random access memory (DRAM), read only memory (ROM), and various levels of internal or external cache memory, to name a few. The microprocessor 92 is also connected to a storage device 96 such as a hard disk drive, floppy drive, compact disc/digital video disc (CD/DVD) drive, tape drive or other mass storage devices such as those that incorporate semiconductor memory ICs using embodiments of the invention. The microprocessor 92 optionally includes the three-dimensional-memory architecture in its internal cache memory, for instance. The memory 94 also optionally includes the three-dimensional-memory architecture in its memory ICs, such as in BIOS or other system memory areas such as DRAM and ROM circuits. The microprocessor 92 is further connected to a display device 98 that also optionally incorporates memory ICs that utilize embodiments of the invention. Therefore, in an electrical device, there optionally are one or more implementations of various embodiments of the invention, thus demonstrating the widespread applicability of various embodiments of the invention in improving existing electrical devices.

Figure 25:
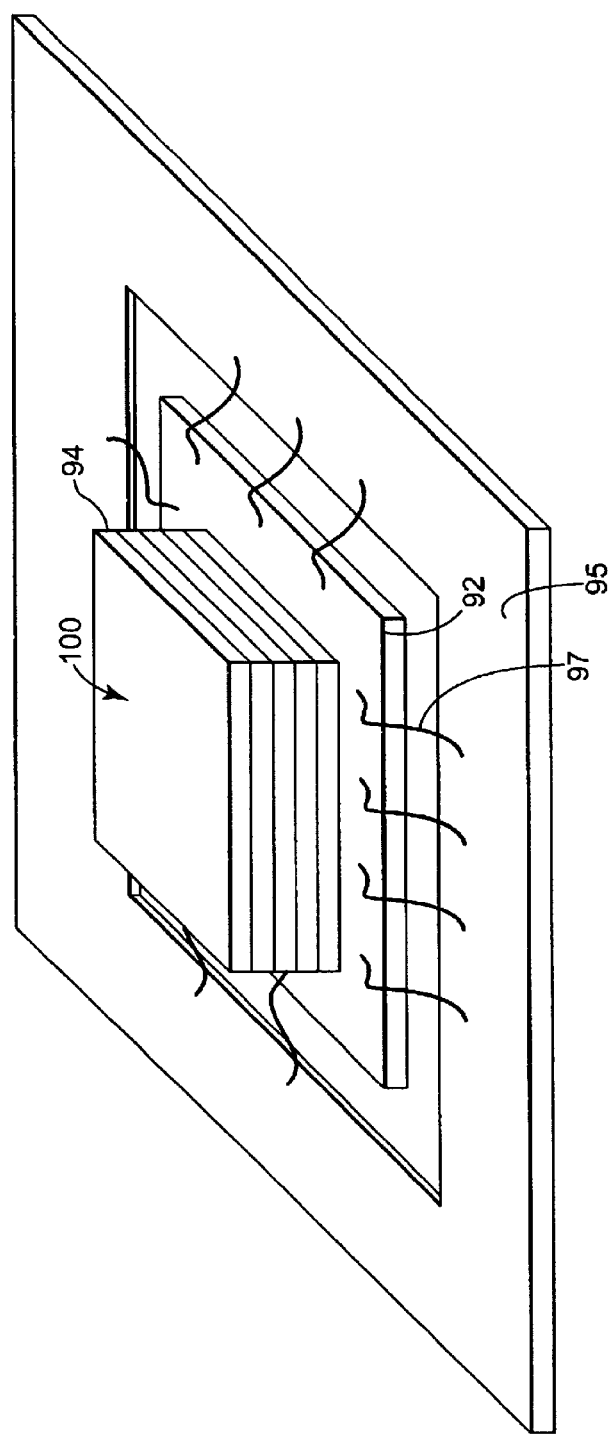
FIG. 25 shows an embedded cubic memory array according to an embodiment of the invention.

For instance, FIG. 25 is an example embodiment of an embedded cubic memory array 100 that integrates the memory 94, such as level 1 and/or level 2 cache, with the microprocessor 92. The embedded cubic memory array 100 is fabricated on top of the die of microprocessor 92 thereby enabling a smaller die area size. Microprocessor 92 forms a horizontal substrate surface. Memory 94 is built of e.g. one or more vertical layers of memory cells 22 or 23 (not shown in FIG. 25) to form the embedded cubic memory array 100. The memory cells 22 or 23 are interconnected by a first and second set of select-lines. At least one of the select-lines is formed within the embedded cubic memory array 100 as one or more vertical pillars. The sets of select-lines are electrically connected to selection circuitry formed on the die of microprocessor 92. The microprocessor 92 is electrically attached to a package 95 such as with bonding wires 97 or tape-automated-bonding (TAB) circuit technology. After the microprocessor is attached to package 95 it is encapsulated (not shown) to provide protection from contaminants and handling. Although the embedded cubic memory array 100 is shown as disposed on a microprocessor integrated circuit, those of skill in the art will appreciate that any integrated circuit that utilizes memory circuits may be substituted for the microprocessor 92. One example is a graphics display controller.

According to a process of making a memory, an array of a set of word-lines is formed in a plane that is substantially parallel to a substrate or other planar surface. An array of a set of bit-lines is formed substantially normal to the plane or word-lines or the substrate surface. By forming the bit-lines normal to the plane of the substrate and hence the word-lines, a set of vertical pillar bit-lines is created. An array of memory cells is formed e.g. between each respective word-line and each bit-line, although some intersections of word-lines and bit-lines optionally do not contain memory cells if those address locations are desired to be unprogrammable.

Figure 26:
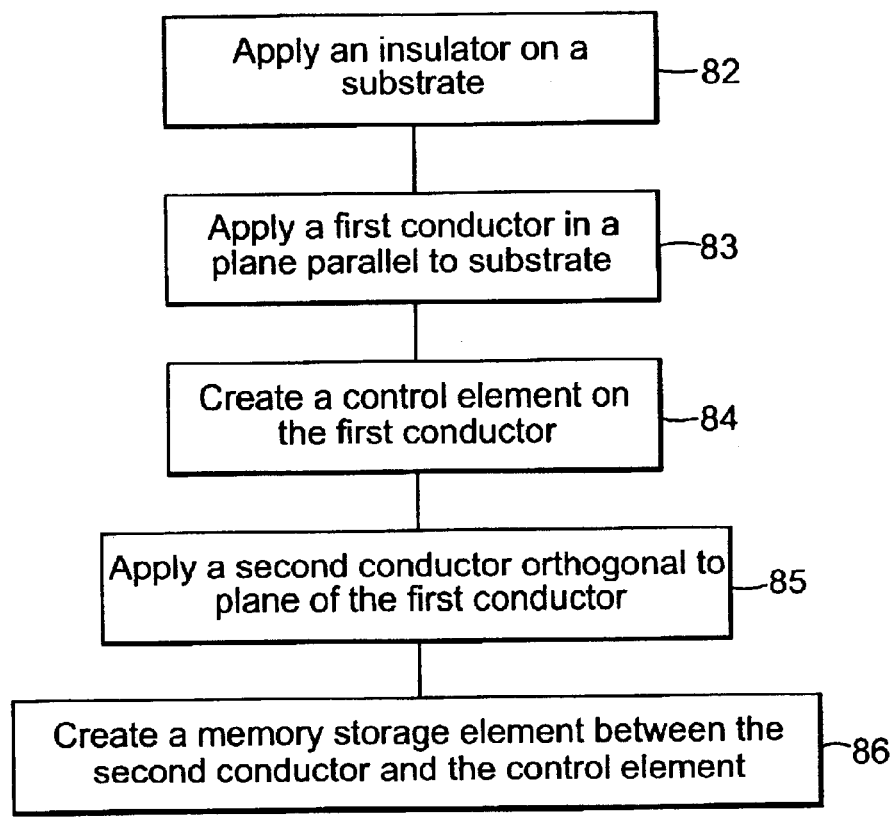
FIGS. 26–28 are flow charts according to embodiments of the invention.

FIG. 26 is a flow chart showing creation of a memory cell according to embodiments of the invention. At 82, an insulator, such as ILD 40, is applied on a substrate surface, e.g. a substantially planar surface. At 83, a first conductor is applied in a plane parallel to the substrate to form a word-line. At 84, a control element is created on the first conductor, such as a tunnel junction device or a diode. At 85, a second conductor that is orthogonal (normal or perpendicular) to the plane of the first conductor is applied to the processed substrate surface. At 86, a memory storage element is created between the second conductor and the control element. The memory storage element is e.g. a tunnel junction antifuse device, but other memory storage elements are alternately useable.

Figure 27:
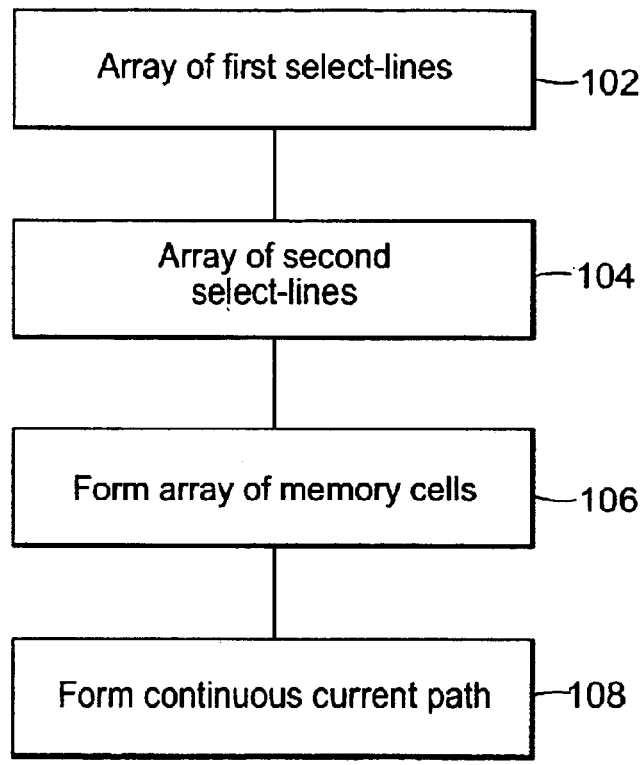

FIG. 27 is a flow chart showing a method of creating a memory circuit according to an embodiment of the invention. At 102 is an array of first select-lines 20, e.g. in a plane generally parallel to a substrate 10, and at 104 is an array of second select-lines 18, e.g. generally orthogonal to the plane of the first select-lines 20. At 106, the method comprises forming an array of memory cells 22, each memory cell respectively coupled to a respective first and second select-line 20, 18, and at 106, forming at least one continuous current path 19 through multiple second select-lines 18 for erasing selected memory cells 22. At least one phase-change storage element 24 is provided in each memory cell 22, according to embodiments of the invention.

Figure 28:
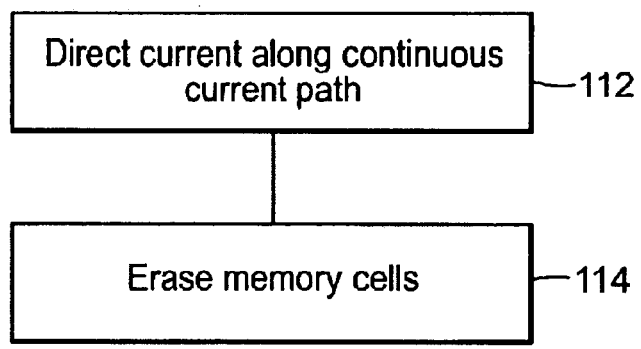

FIG. 28 is a flow chart showing a method of operating a memory circuit 30 according to an embodiment of the invention, the memory circuit 30 having a plurality of first select-lines 20, a plurality of second select-lines 18 disposed generally orthogonal to the first select-lines 20, and a plurality of memory cells 22 associated with the first select-lines 20 and the second select-lines 18. At 112, the method comprises directing current along a continuous current path 19 through multiple second select-lines 18 to heat the multiple second select-lines 18, and at 114, erasing memory cells 22 adjacent the heated multiple second select-lines 18.

Embodiments of the invention also extend to at least one computer-readable medium having stored thereon a computer program that, when executed by a processor, causes any of the methods contemplated herein, for example a method of operation of memory circuit 30, the memory circuit 30 having a plurality of first select-lines 20, a plurality of second select-lines 18 disposed generally orthogonal to the first select-lines 20, and a plurality of memory cells 22 associated with the first select-lines 20 and the second select-lines 18, the program comprising logic for directing current along a continuous current path 19 through multiple second select-lines 18 to heat the multiple second select-lines 18, and logic for erasing memory cells 22 adjacent the heated multiple second select-lines 18.

What is claimed is:

1. A memory array, comprising:
   a substrate;
   a plurality of first select-lines disposed in a plurality of planes generally parallel to the substrate;
   a plurality of second select-lines formed in pillars disposed generally orthogonal to the substrate;
   a plurality of memory cells coupled to the first select-lines and the second select-lines; and
   a current path connection providing a continuous current path simultaneously through a selected plurality of the pillars to heat the selected pillars to cause at least one memory cell associated with the selected pillars to be reset.

2. The memory array of claim 1, wherein the memory cells each comprise a phase-change storage element.

3. The memory array of claim 2, wherein the phase-change storage element comprises a chalcogenide material.

4. The memory array of claim 1, further comprising control logic for selecting ends of the continuous current path to determine the selected pillars.

5. The memory array of claim 4, wherein the control logic is provided in the substrate.

6. The memory array of claim 1, wherein the memory cells are rewritable memory cells.

7. The memory array of claim 1, wherein the continuous current path enables multiple memory cells to be reset generally simultaneously.

8. The memory array of claim 1, wherein each memory cell comprises a control element in series with a memory storage element.

9. An integrated circuit comprising a memory array the memory array comprising:
a substrate;
a plurality of first select-lines disposed in a plurality of planes generally parallel to the substrate;
a plurality of second select-lines formed in pillars disposed generally orthogonal to the substrate;
a plurality of memory cells coupled to the first select-lines and the second select-lines; and
a current path connection providing a continuous current path simultaneously through a selected plurality of the pillars to heat the selected pillars to cause at least one memory cell associated with the selected pillars to be reset.

10. A computing device comprising a memory array, the memory array comprising:
a substrate;
a plurality of first select-lines disposed in a plurality of planes generally parallel to the substrate;
a plurality of second select-lines formed in pillars disposed generally orthogonal to the substrate;
a plurality of memory cells coupled to the first select-lines and the second select-lines; and
a current path connection providing a continuous current path simultaneously through a selected plurality of the pillars to heat the selected pillars to cause at least one memory cell associated with the selected pillars to be reset.

11. A method of creating a memory circuit, comprising:
forming an array of memory cells, each memory cell respectively coupled to a first select-line of an array of first select-lines in a plane generally parallel to a substrate and to a second select-line of an array of second select-lines generally orthogonal to the plane of the first select-lines; and
forming at least one continuous current path through multiple second select-lines for erasing selected memory cells, the continuous current path extending in a first direction through one second select-line, over to another second select-line, and in a second direction generally opposite the first direction through said another second select-line.

12. The method of claim 11, wherein forming the array of memory cells comprises providing at least one phase-change storage element in each memory cell.

13. The method of claim 11, wherein the memory cells share second select-lines.

14. A method of operating a memory circuit having a plurality of first select-line, a plurality of second select-lines disposed generally orthogonal to the first select-lines, and a plurality of memory cells associated with the first select-lines and the second select-lines, the method comprising:
directing current along a continuous current path simultaneously through multiple second select-lines to heat the multiple second select-lines; and
erasing memory cells adjacent the heated multiple second select-lines.

15. A memory, comprising:
a plurality of select-line means;
a plurality of memory-cell means associated with the select-line means; and
means for directing electrical current along a single path simultaneously through multiple select lines of a chosen subset of the select-line means so as to change the state of memory-cell means associated with the chosen select-line means.

16. The memory of claim 15, wherein the memory-cell means comprise phase-change storage elements that change phase upon heating.

17. The memory of claim 15, wherein the means for directing electrical current heats the chosen select-line means.

18. The memory of claim 15, further comprising complementary metal oxide semiconductor (CMOS) logic for determining which of the plurality of select-line means is chosen.

19. A memory, comprising:
a substrate;
a plurality of first select-lines disposed in more than one plane generally parallel to the substrate;
a plurality of second select-lines formed in pillars disposed generally orthogonal to the substrate;
a plurality of memory cells coupled to the first select-lines and the second select-lines; and
a plurality of heater current sources for directing current simultaneously through chosen second select-lines, the heater current sources including at least one of the first select-lines.

20. The memory of claim 19, wherein the heater current sources comprise switches for directing current through the chosen second select-lines.

21. The memory of claim 20, wherein the switches comprise diodes.

22. The memory of claim 20, wherein the switches comprise pn diodes.

23. At least one computer-readable medium having stored thereon a computer program that, when executed by a processor, causes operation of a memory circuit, the memory circuit having a plurality of first select-lines, a plurality of second select-lines disposed generally orthogonal to the first select-lines, and a plurality of memory cells associated with the first select-lines and the second select-lines, the program comprising:
logic for directing current along a continuous current path simultaneously through multiple second select-lines to heat the multiple second select-lines; and
logic for erasing memory cells adjacent the heated multiple second select-lines.

24. A cubic memory array, comprising:
a substrate;
a plurality of first select-lines disposed in a plurality of planes generally parallel to the substrate;
a plurality of second select-lines formed in pillars disposed generally orthogonal to the substrate; and
a plurality of memory cells coupled to the first select-lines and the second select-lines;
wherein at least one of the memory cells includes a control element in series with a memory storage element and wherein the memory storage element is formed using a tunnel junction on edges of the first select-lines and the second select-lines.

25. The cubic memory array of claim 24, further comprising a current path connection providing a continuous current path through a selected plurality of the pillars to heat the selected pillars to cause at least one memory cell associated with the pillars to be reset.

26. The cubic memory array of claim 24, further comprising at least one continuous current path through multiple second select-lines for erasing selected memory cells, the continuous current path extending in a first direction through one second select-line, over to another second select-line, and in a second direction generally opposite the first direction through said another second select-line.

* * * * *

UNITED STATES PATENT AND TRADEMARK OFFICE
CERTIFICATE OF CORRECTION

PATENT NO. : 6,839,263 B2
APPLICATION NO. : 10/358706
DATED : January 4, 2005
INVENTOR(S) : Peter Fricke et al.

It is certified that error appears in the above-identified patent and that said Letters Patent is hereby corrected as shown below:

On the face page, in field (75) in inventors, in column 1, line 2, delete "Andrew VanBrocklin" and insert -- Andrew Van Brocklin --, therefor.

In column 17, line 1, in Claim 9, after "array" insert -- , --.

In column 17, line 47, in Claim 14, delete "select-line" and insert -- select-lines --, therefor.

Signed and Sealed this

Twenty-seventh Day of October, 2009

David J. Kappos
*Director of the United States Patent and Trademark Office*